United States Patent [19]

Wanat et al.

[11] 4,157,918
[45] Jun. 12, 1979

[54] LIGHT SENSITIVE FILM COMPOSITION

[75] Inventors: Stanley F. Wanat, Scotch Plains; Oliver A. Barton, Florham Park, both of N.J.

[73] Assignee: American Hoechst Corporation, Somerville, N.J.

[21] Appl. No.: 836,345

[22] Filed: Sep. 26, 1977

[51] Int. Cl.$^2$ ............................ G03C 1/52; G03C 1/78
[52] U.S. Cl. ................................... 96/75; 96/87 R; 96/91 R; 96/91 D
[58] Field of Search ............... 96/86, 87 R, 75, 91 R, 96/91 D

[56] References Cited

U.S. PATENT DOCUMENTS

| | | | |
|---|---|---|---|
| 2,627,088 | 2/1953 | Alles | 96/87 A |
| 3,036,913 | 5/1962 | Burg | 96/86 P |
| 3,136,637 | 6/1964 | Larson | 96/75 |
| 3,671,236 | 6/1972 | Beusekom | 96/75 |

*Primary Examiner*—Mary F. Kelley
*Attorney, Agent, or Firm*—Leo S. Burnett; Michael J. Tully

[57] ABSTRACT

Light sensitive coating compositions containing a dyestuff, which compositions exhibit improved adhesion to transparent film substrates, are disclosed. For example, the adhesion between a polyester base film and a light sensitive coating composition containing a light sensitive diazo material, a resinous binder and a dyestuff is improved by additionally incorporating into the composition an effective amount of an adhesion promoter based on a copolyester obtained by the esterification and subsequent polymerization of a lower alkylene glycol with a mixture of terephthalic acid, isophthalic acid, and at least one acyclic dicarboxylic acid. These coating compositions may be readily removed from the base film by appropriate lithographic developer solutions without substantial residual staining of the film by the dyestuff present in the coating composition.

12 Claims, No Drawings

LIGHT SENSITIVE FILM COMPOSITION

BACKGROUND OF THE INVENTION

The present invention relates to coating compositions containing a light sensitive diazo substance combined with a colorant, which compositions exhibit improved adhesion to polyester film substrates.

In the art of full color lithographic printing, a plurality of printing plates are provided, each designed to print one of three or four colors such as cyan, magenta, yellow and optionally black. Printing of these colors in superimposed registration on a receptor sheet gives rise to the final full color lithographic image. In order to make the three or four printing plates, the colored original is "separated" photographically, usually by the use of filters, into a set of three or four negatives, each representing one of the colors and containing the amount of that color which must be printed in order for a composite of three or four printed colors to produce the desired total color print.

Prior to the manufacture of each plate for the printing press, the quality of each color separation negative is usually evaluated by the use of proof sheets. These sheets comprise a transparent base sheet coated with a light sensitive composition containing an appropriately colored dye or pigment. In a negative-working proof sheet, the dyed sheet is exposed to actinic light through its respective color separation negative, whereby a photochemical reaction causes the exposed areas to harden in imagewise configuration. Subsequent development and removal of the non-image areas yields a sheet which contains the desired color pattern in the image areas, while being substantially transparent in the non-image areas. In like fashion, similar proof sheets are prepared using the other color separation negatives in each of the colors to be printed. After each of the separate sheets are made, they are assembled together in registry on a white background, whereupon a color proof results. Examples of various kinds of proof sheets and the way they are used may be found in U.S. Pat. Nos. 3,136,637 and 3,671,236; and Canadian Pat. No. 935,018.

As mentioned above, the typical proof sheet adapted for imagewise color exposure consists in the most elementary form of a transparent base sheet coated on one side with a light sensitive composition containing a dyestuff. Most commonly with negative acting materials, the light sensitive composition is composed of a diazo material, used either alone or in combination with a resinous binder, which composition is caused to harden by exposure to a source of actinic light. The hardening occurs as the result of a photopolymerization, condensation, or coupling reaction which renders the light struck areas insoluble in common developer solutions such as aqueous alkaline developers, while the non-light struck areas remain substantially chemically unaltered and soluble. Once developed, the light struck areas of the coating exposed through a negative transparency remain adhered to the base sheet in the form of a positive image.

One of the major problems associated with the preparation and use of the aforementioned proof sheet is poor adhesion between the base sheet and the light sensitive coating. Poor adhesion may give rise to the removal of some of the hardened coating during development, particularly in the margin areas, where the image and non-image portions interface. This is generally caused by a seepage of developer solution into these areas between the hardened coating and the base sheet. The result is that the imaged proof sheet may lack the resolution and image clarity desired, and may even chip off the base as the result of handling.

One technique for improving adhesion involves a physical treatment of the base sheet prior to application of the light sensitive coating, such as a roughening of the surface by sand blasting, by rubbing with abrasives, or by rubbing with metal brushes. This kind of mechanical treatment generally improves adhesion, but seriously reduces the transparency of the base material. Consequently, the finished proof sheets are less than satisfactory from a visual or color standpoint.

Another technique which has been employed commercially is to first coat the untreated base sheet with a thin layer of an adhesive substance which adheres strongly to the base sheet and to the light sensitive coating after it is applied thereto. For example, as disclosed in U.S. Pat. Nos. 2,627,088 and 3,481,736, polyethylene terephthalate film may be coated or "subbed" with a thin adhesive layer composed of a terpolymer of vinylidene chloride/methyl acrylate/itaconic acid, which layer serves to anchor the subsequently applied resinous coating. When these subbed proof sheets are developed, it is found that the coating in the non-image areas of the proof sheet is readily removed and that the resolution and image clarity of the finished sheet are good. However, the adhesive or sub layer tends to become stained by the particular dyestuff present in the light sensitive coating, giving rise to an undesirable tinting of the background areas of the proof sheet which are supposed to be free of residual coating or coloring material. This tinting distorts the true color composite when a plurality of proof sheets are superimposed for proof inspection.

Accordingly, it is an object of the present invention to provide color lithographic proof sheets exhibiting improved adhesion between the transparent base sheet and light sensitive coating composition.

Another object of the invention is to provide color lithographic proof sheets wherein pretreatment of the base sheet, such as by roughening or by the application of an adhesive sublayer, is avoided.

A further object of the invention is to provide color lithographic proof sheets wherein the background or non-image areas of the sheet are not substantially stained.

SUMMARY OF THE INVENTION

These and other objects of the invention may be achieved by providing a proof sheet material comprising a transparent base sheet or film, the surface of which need not have been mechanically roughened or subbed with an adhesive layer, and a light sensitive coating composition on the surface of said film which is composed of a mixture of a light sensitive material, a resinous binder, a coloring material, and an effective amount of an adhesion promoter which is based on a copolyester which is obtained by the esterification and subsequent polymerization of a lower alkylene glycol with a mixture of terephthalic acid, isophthalic acid, and at least one acyclic dicarboxylic acid. The light sensitive coating compositions of this invention exhibit extremely good adhesion to film substrates, particularly polyester film substrates, and yet are readily removable from the substrate in imagewise configuration after exposure and development of the proof sheet without leaving behind any substantial coloring material on the background area of the substrate which is freed of residual coating.

DETAILED DESCRIPTION OF THE INVENTION

The components of the light sensitive coating compositions of the present invention other than the adhesion promoter may be the conventional components which are known in the art for such coatings used in positive acting or negative acting light sensitive systems. One important caveat with regard to the selection of the various coating formulations is that the components must be compatible with the adhesion promoter because otherwise the image areas on the proof sheet would not be as transparent as they must be to be useful as a color proofing system.

The adhesion promoter of the present invention is composed in major proportion of a linear copolyester obtained by forming an esterification product of a mixture of ethylene glycol from about 20 to 60 mol percent based on the total amount of acids of terephthalic acid, about 15 to 50 mol percent of isophthalic acid, and about 10 to 65 mol percent of at least one acyclic dicarboxylic acid or acid ester selected from the group consisting of suberic, azelaic and adipic acids, and alkyl esters of these acids wherein the alkyl group contains from 1 to 7 carbon atoms. The linear polyesters are preferably prepared by reacting the aforementioned monomers under conditions effective to promote ester interchange to form the corresponding glycol esters under reduced pressure and in the presence of a polymerization catalyst to form the copolymer. Linear copolyesters having a relative viscosity within the range of about 1.3 to 7.0, determined as a solution of 0.6 gram of the copolyester in 100 grams of metacresol at 77° F., are most suitable for the purpose of this invention. A more complete description of the method for preparing the copolyesters upon which the adhesion promoter useful in the present invention is based may be found in U.S. Pat. No. 2,465,319, the disclosure of which is incorporated herein by reference.

The copolyester adhesive promoter composition may also contain, if desired, additives which tend to modify somewhat the tack or blocking characteristics of the adhesive. For example, from about 2 to 10% by weight based on the copolyester of an inert particulate material may be included, and preferably the particulate material has a particle size of less than about 10 microns. Examples of such material include silica, starch, talc, and clay. Other additives which may be included are waxy materials such as paraffin, fatty alcohols, fatty esters and the like, preferably at a level of about 0.5 to 5% by weight based on the copolyester. Adhesive compositions similar to those described herein are disclosed in U.S. Pat. No. 3,142,434.

Commercially available adhesion promoters made in accordance with the description above are supplied by du Pont under the designations 49001 and 56065.

As pointed out previously, the resinous binder material which in the major component in the dried light sensitive coating composition of the present invention must be a material with which the polyester based adhesion promoter is compatible and, accordingly, should be a material which contains polar groups either in the main molecular structure or pendant thereto. Other than this restriction, essentially any of the known prior art binders which have been disclosed either for positive acting or negative acting light sensitive coating compositions may be used.

In negative acting systems, the binder material may be relatively inert to photochemical reaction, serving merely as a carrier for the light sensitive materials, colorants, and other additives which may be present in the coating composition. Exemplary of suitable binder materials include cellulose esters such as cellulose acetate, cellulose acetate succinate are cellulose acetate butyrate; polyvinyl acetals such as polyvinylbutyral and polyvinyl formal; polyamide resins; copolymers of vinyl chloride with polar monomers such as acrylonitrile, acrylic or methacrylic acid or their esters, and with vinyl acetate; polymeric esters such as polyvinyl acetate or copolymers of vinyl acetate with acrylic acid, methacrylic acid and their esters, or with maleic acid or maleic anhydride; copolymers of styrene with acid functional comonomers such as ethyl acrylate, vinyl acetate and maleic anhydride; natural polymers such as gelatin, casein or fish glue; polyvinyl alcohol; polyacrylamides; and like materials. In a positive acting system, the resinous binder materials most commonly employed are selected from alkali soluble resins such as phenol/formaldehyde novolak resins and like materials.

The coloring agents employed in the present invention include those dyestuffs and pigments which are known in the art and which have colors substantially identical with the standard colors of inks required for color proofing, e.g. yellow, cyan, magenta and black. Examples of suitable colorants include Grasol Fast Yellow 5GL (C.I. Solvent Yellow 27), Grasol Fast Rubine 2BL (C.I. Solvent Red 128), Victoria Pure Blue FGA (C.I. Basic Blue 81), Neozapon Yellow GG (C.I. Solvent Yellow 79), Neozapon Fast Red BE (C.I. Solvent Red 122), Sudan Blue II (C.I. Solvent Blue 35-C.I. 61554 (S)), Victoria Cyan F6G (C.I. 42025), Rhodamine FB (C.I. 45170), Rhodamine 6GDN Extra (C.I. 45160), Auramine Concentrate (C.I. 41000), carbon black and like materials.

Typical of the light sensitive compositions found suitable for the purposes of this invention are iminoquinone diazides, quinone diazides, and condensation products of aromatic diazonium compounds together with appropriate binders. Such sensitizers are described in U.S. Pat. Nos. 3,175,906, 3,046,118, 2,063,631, 2,667,415, 3,867,147 with the compositions disclosed in the last being in general preferred.

Iminoquinone diazides suitable for this invention are shown by the general formula:

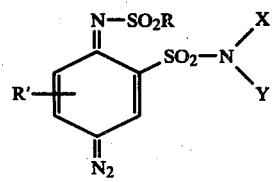

These are negative acting compounds

In this formula R is an aryl or substituted aryl radical, X is hydrogen or alkyl, Y is an alkyl, aryl, substituted aryl and R' is hydrogen, halogen, an alkyl radical or an alkoxy radical. Examples of individual iminoquinone diazides suitable for this invention are:

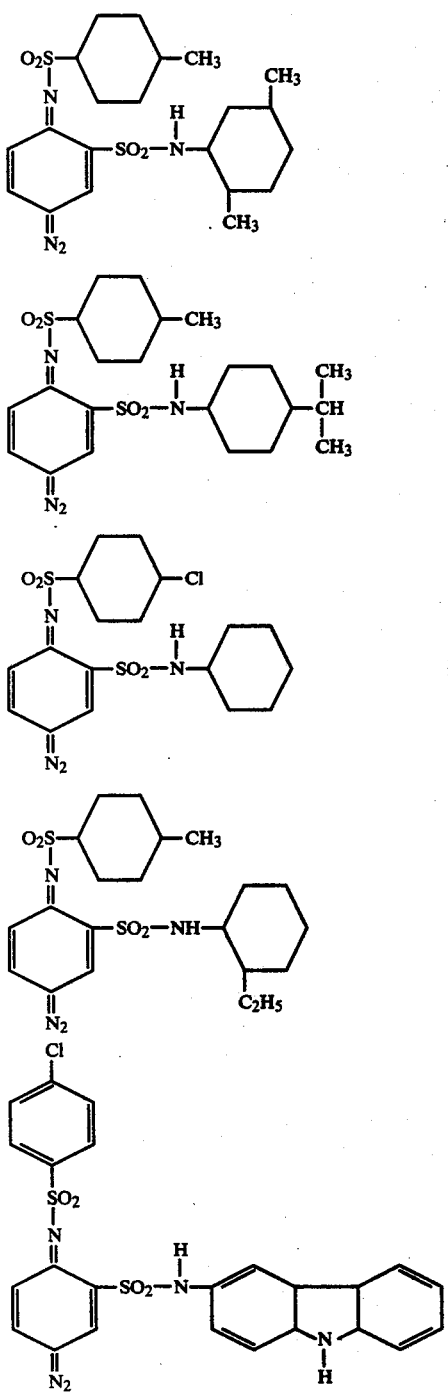

Naphthoquinone diazides suitable for this invention are shown by the general formula:

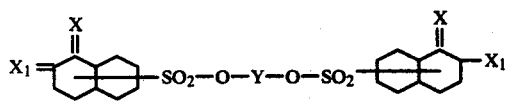

in which X and X₁ and N₂ or O, those attached to the same ring being different, and Y is an organic linkage containing at least one arylene, substituted arylene or heterocyclic radical. These are positive working compounds. Examples of individual naphthoquinone diazides suitable for this invention are:

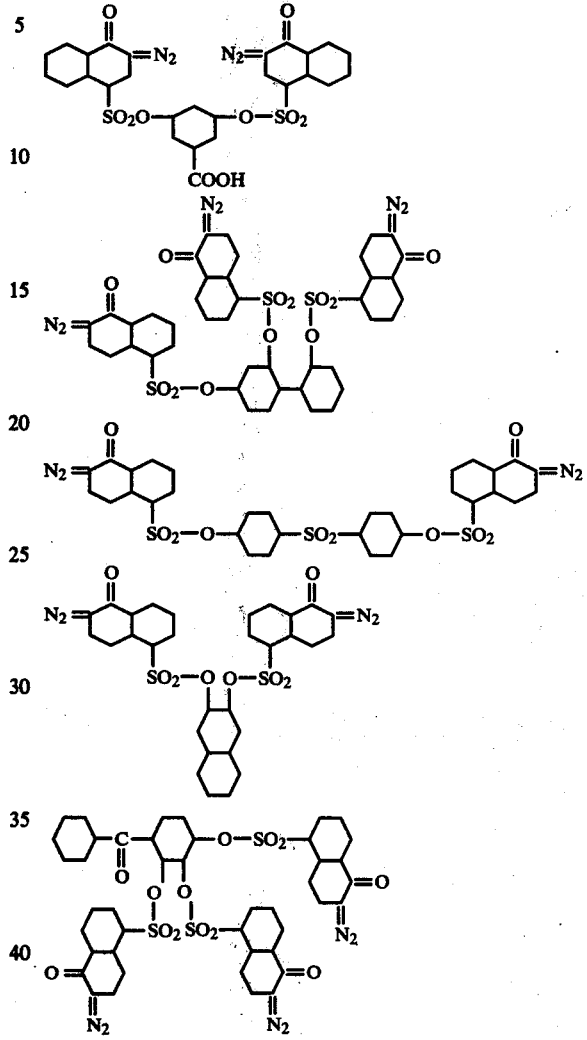

They are typically used with novolak binders.

Diazonium compounds for use in this invention include mixed condensation products of 4-aminodiphenylamine and substituted 4-amino-diphenylamines (in the form of their salts) with formaldehyde and a second component, including among others, substituted phenols and phenol ethers.

Suitable mixed condensation products include those obtained by condensing a diphenylamine-4-diazonium salt with formaldehyde and either phenol, 4-hydroxycinnamic acid, mesitylene, or 2-phenoxy-ethanol. Alternatively 3-methoxy-diphenylamine-4-diazonium salt is condensed with formaldehyde and either 4-nitrodiphenyl, 2,6-dimethylol-4-methyl-phenol, 4,4'-dimethoxy methyl diphenylether or 1,3 diisopropyl-4,6-dimethylolbenzene. As a further alternative, 2,5-dimethoxy-4-phenoxy-benzene diazonium salt is condensed with formaldehyde and 1,3-diisopropyl-4,6,dimethoxymethyl benzene. These mixed condensates are negative-working compounds.

It is to be emphasized that the specific light sensitive compositions which may be employed in the present invention are conventional in the art and should be selected by one skilled in the art based on compatibility and operability in the binder system disclosed herein.

The light sensitive coating compositions containing the adhesion promoter may be most conveniently applied to the film substrate by forming a solution or dispersion of the coating ingredients in suitable solvent, applying the desired quantity of the solution to the surface of the film by any suitable technique such as roller coating, dip coating, doctor blade coating or whirler coating, and drying to evaporate the solvent. The dry coating thickness is preferably in the range of about 0.1μ to about 10μ. Suitable solvents which may be employed should be selected based on the solubility characteristics of the light sensitive compositions and include dimethyl sulfoxide, dimethyl formamide, tetrahydrofuran,, glycol ethers such as ethylene glycol monomethyl ether and ethylene glycol mono ethyl ether, esters such as ethyl acetate, butyl acetate and amyl acetate; ketones such as methyl ethyl ketone, cyclohexanone and diacetone alcohol, and mixtures of these.

The composition of the coating on a dry basis generally shall range in the order of about 25 to 75% by weight of binder material, about 1 to 15% by weight of the adhesion promoter composition, an effective amount of a colorant, generally in the range of about 2 to 15% by weight, and of course effective amounts of the light sensitive materials as are known in the art. The concentration of the solids in the coating solution prior to application to the substrate and drying depends upon the coating method used in depositing the coating, but generally solutions containing from about 2 to 20% by weight solids are satisfactory, of which amount the adhesion promoter comprises about 0.25 to 0.75% by weight.

Exemplary of transparent film substrates to which the coating may be applied are those polymeric films manufactured from polymers containing polar groups in or pendant the polymer chain such as polyesters, cellulose acetate and polyvinyl chloride. Such films generally have a thickness of from about 1-5 mils, preferably about 2-3 mils. The adhesion characteristics are maximized when a polyester film material is employed.

The following examples are illustratative of the invention.

EXAMPLE I

Two photopolymerizable negative acting photosensitive compositions were prepared. The first, formula a, had the following composition:

| | a Grams |
|---|---|
| Methyl cellosolve | 184.24 |
| Methyl ethyl ketone | 180.32 |
| Adhesion Promoter 49001 | 1.96 |
| p-Toluene sulfonic acid | 0.10 |
| Styrene/maleic anhydride copolymer Available under the trademark Lytron 820 (Monsanto) | 21.87 |
| Victoria Cyan Dye (BASF) | 0.392 |

The second, formula b, differed only in the substitution of 5.03 grams of Adhesion Promoter 56065 for Adhesion Promoter 49001.

The properties of these adhesive promoters are given in the du Pont bulletin, "Polyester Resins, Adhesives and Coatings" E-04009 (1973). The specific gravity of 49001 is 1.22; that for 56065 is 1.24 (as dry solids). For both, the flow melt temperature °C., is 60, acid number 2, hydroxyl number 10 and glass transition temperature °C., −10.

Adhesion Promoter 56065 is supplied by du Pont as a 40% solution in methyl ethyl ketone. It has a Brookfield viscosity of 120–375 cps. at 77° F.

The adhesion promoter was first dissolved in the solvent, followed by addition of the styrene/maleic anhydride copolymer binder, the acid and the dyes. The entire system was stirred for approximately 30–45 minutes until the components substantially dissolved. At this point, 3.0 grams of a sensitizer of the type disclosed in U.S. Pat. No. 3,175,906, was stirred into 97.0 grams of the above stock solutions for about 30 minutes, after which time the compositions were ready for coating onto a polyester film substrate. For comparison, another solution was also prepared, omitting any Adhesion Promoter.

In order to evaluate the adhesive qualities and staining characteristics of the compositions prepared above, a number of different commercially available transparent polyester film materials, all 3 mils thick, were coated. Coating was accomplished by depositing the various solutions on one surface of the film and spinning or whirler coating the film to allow the solution to spread evenly on the surface as the result of centrifugal forces. The coated films were then dried at 100° C., which resulted in a dry coating thickness of about 0.3 microns. The coated films were then exposed for 45 units (ca. 45 seconds) on a Berkey-Ascor exposure unit and the image developed by treatment with an alkaline developer solution.

Three types of polyester film were coated with each of the two formulations given above. The film designated PE-1 is a polyethyleneterephthalate film having its surface treated to improve adhesion of subsequently applied coatings, and is commercially available under the tradename Melinex 505, a product of Imperial Chemical Industries. Films designated PE-2 and PE-3 are two different commercially available polyester films which are not pretreated to improve adhesion and are available under the tradenames Melinex O and Mylar D, available from Imperial Chemical Industries and Du Pont, respectively.

A number of each of these films were coated with the above compositions, dried, exposed and developed as indicated. The films were then tested for adhesion and residual stain determined by visual inspection and by measurement in the Hunter Colorimeter.

Results of adhesion tests and stain tests on the various films are reported in Table 1. The adhesion test is a modification of ASTM-D-3359-74 wherein 1 inch tapes of various adhesive strengths (reported as ounces of pull per inch of width when adhered to steel) were uniformly pressed on the coating and then sharply pulled off. NL indicates no loss of coating. R values indicated the approximate amount of the coating under the tape which was removed from the base film with the tape. The Hunter b colorimeter values are taken on four superimposed 3 mil thicknesses of film at areas of the film where no image appears, which are the areas of coated film where the coating has been completely removed by the developer solution. The more negative the Hunter b value, the less transparent the film due to residual dye stain, or stated, conversely, the closer the Hunter b value to that obtained on the uncoated film, the less the residual stain. These tests were performed using a Hunter Lab Model D25D3P Color Difference Meter in accordance with the Instruction Manual provided with that unit, section 2.1.5—Measurement Values.

As can be seen from Table 1, the uncoated films exhibited positive Hunter b values higher than the values exhibited by any of the other films which had some degree of residual staining in the developed areas. However, the staining was more severe with the control formulation, particularly with the PE-1 film material, the surface of which was pretreated to improve adhesion. The adhesive characteristics of the formulations of Example 1 containing the adhesive promoter 49001 coated on untreated polyester films PE-2 and PE-3 are superior to the control formulation coated on the same class of film.

TABLE I

| Coating Composition | Film Base | Adhesion Tape Test (oz/in width) | | | Hunter b Values (12 mils thickness) |
|---|---|---|---|---|---|
| | | 30 | 40 | 60 | |
| Uncoated Base | PE-1 | | | | + 3.84 |
| | PE-2 | | | | + 4.49 |
| | PE-3 | | | | + 4.84 |
| Control No Adhesion Promoter | PE-1 | NL | NL | NL | − 8.90 |
| | PE-2 | NL | NL | ½ R | − 6.50 |
| | PE-3 | NL | NL | ½ R | − 5.30 |
| With Adhesion Promoter 49001 (Formula a) | PE-2 | NL | NL | ½ R | + 2.89 |
| | PE-3 | NL | NL | NL | − 1.05 |
| With Adhesion Promoter 56065 (Formula b) | PE-2 | NL | NL | NL | − 4.30 |
| | PE-3 | NL | NL | NL | − 8.30 |

EXAMPLE 2

A second pair of photosensitive coating formulations was prepared exactly as in Example 1, except for the identity of the diazo sensitizer. In this example, 1.0 g. of a sensitizer of the type disclosed in U.S. Pat. No. 3,867,147, was stirred into 99.0 gms of the stock solutions of Example 1. Complete solution required about ½ hour of stirring.

The solution was whirler-coated on 3 mil polyester sheet, as in Example 1, to a dry film thickness of about 0.3 microns along with controls containing no adhesion promoter. The sheet was exposed for 12 units (Berkey Ascor, ca. 12 seconds). The images were developed with dilute alkali developer. Test results are shown in Table 2.

TABLE 2

| Coating Composition | Film Base | Adhesion Tape Test (oz/in.) | | | Hunter b Values 12 mil thickness) |
|---|---|---|---|---|---|
| | | 30 | 40 | 60 | |
| No Adhesion Promoter | PE-1 | NL | NL | NL | − 5.30 |
| | PE-2 | NL | NL | ½ R | + 5.40 |
| | PE-3 | NL | ½ R | ½ R | + 3.20 |
| With Adhesion Promoter 49001 (Formula a) | PE-2 | NL | NL | ½ R | + 3.65 |
| | PE-3 | NL | NL | NL | + 2.60 |
| With Adhesion Promoter 56065 (Formula b) | PE-2 | NL | NL | NL | − 2.89 |
| | PE-3 | NL | NL | NL | − 2.60 |

It is seen from the first row of data (no adhesion promoter added to the coating composition) that adhesion is better with PE-1 (treated to promote adhesion) but staining is greater than with the untreated films, PE-2 and PE-3. However, upon use of the adhesion promoters in coating solutions, used on untreated films PE-2 and PE-3 (second row of data) adhesion is improved and staining is satisfactory, although slightly higher. In this example, stain was lower with Adhesion Promoter 49001 than with 56065.

EXAMPLE 3

Using the procedure of Example 1, two formulations were prepared. The first, formula a, had the following composition:

| | a Grams |
|---|---|
| Methyl cellosolve | 46.50 |
| Methyl ethyl ketone | 46.50 |
| Adhesion Promoter 49001 | 0.50 |
| p-Toluene sulfonic acid | 0.042 |
| Lytron 820 | 5.00 |
| Victoria Cyan F6G | 0.054 |
| Victoria Pure Blue FGA | 0.445 |
| A sensitizer of the type disclosed in U.S. Pat. 3,867,147 | 0.90 |

The second formula b, differed only in the replacement of Adhesion Promoter 49001 by 1.25 grams of Adhesion Promoter 56065.

The solution was whirler coated on a 3 mil polyester sheet to a dry film thickness of about 0.3 micron. The sheet was exposed for 12 units (Berkey Ascor). The image was developed with a dilute alkali developer. The results are shown in Table 3.

TABLE 3

| Coating Composition | Film Base | Adhesion Tape Test (oz/in width) | | | Hunter b Values (12 mil. Thickness) |
|---|---|---|---|---|---|
| | | 30 | 40 | 60 | |
| Control No Adhesion Promoter | PE-1 | NL | NL | NL | − 5.30 |
| | PE-2 | ½ R | ½ R | ½ R | + 3.80 |
| | PE-3 | ½ R | ½ R | ½ R | + 4.15 |
| With Adhesion Promoter 49001 | PE-2 | NL | NL | NL | + 2.89 |
| | PE-3 | NL | NL | NL | + 2.86 |
| With Adhesion Promoter 56065 (Formula b) | PE-2 | NL | ½ R | ½ R | + 3.40 |
| | PE-3 | NL | NL | ½ R | + 3.60 |

Of the samples of Example 3 the untreated polyester films (PE-2 and PE-3) show poorer adhesion in development and in the tape tests than PE-1, but show less residual stain.

With Adhesion Promoter 49001, both PE-2 and PE-3 develop excellent adhesion, and stain is in a satisfactory range. With Adhesion Promoter 56065, adhesion is nearly as good and staining is somewhat reduced.

EXAMPLE 4

Following the procedure of Example 1, two formulations were prepared. The first, formula a, had the following composition:

| | a Grams |
|---|---|
| Methyl cellosolve | 23.0 |
| Methyl ethyl ketone | 23.0 |
| Adhesion Promoter 49001 | 0.25 |
| Adhesion Promoter (40% solids in MEK 56065) | — |
| p-Toluene sulfonic acid | 0.315 |

-continued

|  | a<br>Grams |
|---|---|
| Lytron 820 (Monsanto) | 3.142 |
| Auramine Concentrate | 0.141 |
| Rhodamine FB | 0.252 |
| Rhodamine 6 GDN Extra | 0.629 |

The second formula b, differed only in the replacement of Adhesion Promoter 49001 by 1.25 grams of Adhesion Promoter 56065.

Then 2.0 g. of the Sensitizer #1 was stirred into 80.0 g. of the stock solution. Stirring was continued for ¼ hour after which the solution was whirler coated on a 3 mil sheet of polyester film substrate to a thickness of 0.3 microns. The coatings were dried for 2′ at 100° C. and then exposed through a negative for 45 units in the Berkey Ascor exposure unit. The images were developed with an aqueous alkaline developer. The results are shown in Table 4.

TABLE 4

| | | Sensitizer #1, Magenta | | | |
|---|---|---|---|---|---|
| Coating | Film | Adhesion Tape Test (Oz. Pull/In. Width) | | | Hunter b Values |
| Composition | Base | 30 | 40 | 60 | (12 mil. Thickness) |
| Control | PE-1 | NL | NL | NL | − 5.30 |
| No Adhesion | PE-2 | NL | NL | ¼ R | − 3.00 |
| Promoter | PE-3 | NL | NL | ¼ R | − 4.50 |
| With Adhesion | PE-2 | NL | NL | NL | − 3.60 |
| Promoter 49001 | PE-3 | NL | NL | NL | − 4.50 |
| (Formula a) | | | | | |
| With Adhesion | PE-2 | NL | NL | NL | − 3.50 |
| Promoter 56065 | PE-3 | NL | NL | NL | − 2.40 |
| (Formula b) | | | | | |

Again, it appears that no serious loss of adhesion of the coating for the polyester film base is seen under tape test conditions of the final image as one goes from the treated to the untreated film. Moreover, the b values become more positive, indicating less residual stain.

EXAMPLE 5

The procedure of Example 4 was followed except that Sensitizer #2 was used. This coating was whirler coated to a dry film thickness of 0.6 micron. The coated sheet was exposed, through a negative, for 12 Berkey Ascor units and developed in the usual 1 minute. The following results were obtained:

TABLE 5

| | | Sensitizer #2, Magenta | | | |
|---|---|---|---|---|---|
| Coating | Film | Adhesion Tape Test | | | Values |
| Composition | Base | 30 | 40 | 60 | (12 mil Thickness) |
| Formula of | PE-1 | NL | NL | NL | − 3.30 |
| Exp. 4 without | PE-2 | ¼ R | ¼ R | ¾ R | − 1.30 |
| Adhesion | PE-3 | ¼ R | ¼ R | ¼ R | − 1.90 |
| Promoter | | | | | |
| With Adhesion | PE-2 | NL | NL | ¼ R | − 1.20 |
| Promoter | | | | | |
| 49001 | PE-3 | NL | NL | NL | + 2.89 |
| (Formula a) | | | | | |
| With Adhesion | PE-2 | NL | NL | NL | + 1.20 |
| Promoter | | | | | |
| 56065 | PE-3 | NL | NL | NL | + 1.00 |
| (Formula b) | | | | | |

In this case, the coating on untreated film adhesion appears improved as does the residual stain. Further, the addition of adhesion promoters has further reduced stain and improved adhesion with untreated films.

EXAMPLE 6

The procedure for this example duplicated that of Examples 4 and 5 except that Sensitizer #3 was used. The following results were obtained:

TABLE 6

| Coating | Film | Adhesion Tape Test | | | |
|---|---|---|---|---|---|
| Composition | Base | 30 | 40 | 60 | Hunter b Values |
| Formula of | PE-1 | NL | NL | ¼ R | − 2.30 |
| Examples 4 & % | | | | | |
| without Adhesion | PE-2 | ¼ R | ¼ R | All R | + 4.00 |
| Promoter | PE-3 | ¼ R | ¼ R | ¼ R | + 3.00 |
| With Adhesion | PE-2 | NL | ¼ R | ¼ R | + 3.50 |
| Promoter 49001 | PE-3 | NL | NL | ¼ R | + 2.89 |
| With Adhesion | PE-2 | NL | ¼ R | ¼ R | + 2.50 |
| Promoter 56065 | PE-3 | NL | NL | ¼ R | + 3.20 |
| (Formula b) | | | | | |

The residual stain is considerably improved over the treated system in the absence of adhesion promoter. Treated material shows greater adhesion for the coating and greater stain than untreated films. The untreated films, however, have a satisfactory low level of stain. Addition of adhesion promoters to untreated films greatly improves the adhesion with almost no effect upon stain.

EXAMPLE 7

Two coating systems based on positive acting photosensitive formulations were prepared and coated on films PE-2 and PE-3. The first, Formula a, had the following composition:

| | Solution a<br>Gms.<br>Wt. % |
|---|---|
| Methyl cellosolve | 54.60 |
| Methyl ethyl ketone | 35.90 |
| Victoria Pure Blue FGA | 2.07 |
| Sensitizer of the type disclosed in U.S. Pat. 3,046,118 | 6.93 |
| Adhesion Promoter 49001 | 0.50 |

The second, Formula b, differed only in the replacement of Adhesion Promoter 49001 with 1.25 grams of Adhesion Promoter 56065. The dye and diazo were stirred into the solvent system in the order listed. About 15 minutes of moderate stirring was used to insure solution. A solution was also prepared, omitting any adhesion promoter.

Each of these solutions were then whirler coated to a thickness of 0.3 micron and dried for 2 minutes at 80° C. Coatings were exposed for 20 units on the Berkey Ascor unit and then developed with an alkaline developer. The results are shown in Table 7.

TABLE 7

| | | Sensitizer #4, Cyan | | | |
|---|---|---|---|---|---|
| Coating | Film | Adhesion Tape Test (oz/in width) | | | Hunter b Values 12 mil. |
| Composition | Base | 20 | 40 | 60 | Film Thickness |
| No Adhesion | PE-1 | NL | NL | NL | − 4.83 |
| Promoter | PE-2 | NL | ¼ R | Total R | + 3.26 |
| | PE-3 | NL | ¼ R | Total R | + 2.34 |
| With Adhesion | PE-2 | NL | ¼ R | ¼ R | − 3.13 |
| Promoter 49001 | PE-3 | NL | ¼ R | ¼ R | − 3.81 |
| (Formula a) | | | | | |
| With Adhesion | PE-2 | NL | ¼ R | ¼ R | + 0.15 |

TABLE 7-continued

| Coating Composition | Film Base | Sensitizer #4, Cyan Adhesion Tape Test (oz/in width) | | | Hunter b Values 12 mil. Film Thickness |
|---|---|---|---|---|---|
| | | 20 | 40 | 60 | |
| Promoter 56065 (Formula b) | PE-3 | NL | 1/10R | ⅛ R | −0.62 |

This positive acting system study indicates that, as in the negative systems, the stain is diminished by including the adhesion promoter in compositions coated on untreated film base. However, the adhesive characteristics of this particular positive acting composition on the base film are not quite as good as with negative acting compositions, although some improvement is noted.

What we claim is:

1. A proof sheet comprising a substantially transparent polymeric base sheet having a thin coating of a light sensitive composition adhered to a surface thereof, said light sensitive composition comprising a mixture of:
   (a) a resinous binder;
   (b) a colorant;
   (c) a light sensitive diazo material; and
   (d) an effective amount of an adhesion promoter, said adhesion promoter comprising a linear copolyester obtained by the esterification and subsequent polymerization of ethylene glycol with about 20 to 60 mol percent, based on the total amount of acids, of terephthalic acid, about 15 to 50 mol percent of isophthalic acid, and from about 10 to 65 mol percent of at least one acyclic dicarboxylic acid or acid ester selected from the group consisting of suberic, azelaic, sebacic, and adipic acids, and $C_1$ to $C_7$ alkyl esters of these acids, said adhesion promoter and said resinous binder being substantially compatible.

2. The proof sheet of claim 1 wherein said adhesion promoter is a linear copolyester having a relative viscosity within the range of about 1.3 to 7.0, determined as a solution of 0.6 gram of said copolyester in 100 grams of metacresol at 77° F.

3. The proof sheet of claim 2 wherein said adhesion promoter contains about 2 to 10% by weight based on said copolyester of an inert particulate material having a particle size of less than about 10 microns.

4. The proof sheet of claim 3 wherein the composition of said particulate matter is selected from the group consisting of silica, starch, talcs and clay.

5. The proof sheet of claim 1 wherein said resinous binder contains carboxyl groups in or pendant to the polymer chain.

6. The proof sheet of claim 5 wherein said resinous binder is a copolymer containing polymerized maleic anhydride or vinyl acetate monomers.

7. The proof sheet of claim 6 wherein said resinous binder is a copolymer of styrene and maleic anhydride.

8. The proof sheet of claim 1 wherein said resinous binder is a novolak resin.

9. The proof sheet of claim 1 wherein said light sensitive composition contains about 25 to 75% by weight of resinous binder, about 1 to 15% by weight of adhesion promoter, and effective amounts of colorant and light sensitive materials.

10. The proof sheet of claim 1 wherein said base sheet has a substantially uniform thickness in the range of about 1 to 5 mils and said coating of light sensitive composition has a substantially uniform thickness in the range of about 0.1 micron to about 10 microns.

11. The proof sheet of claim 1 wherein said light sensitive composition comprises a negative diazonium salt.

12. The proof sheet of claim 1 wherein said base sheet is a polyester resin.

* * * * *